United States Patent
Knapp et al.

(10) Patent No.: US 7,664,214 B2
(45) Date of Patent: Feb. 16, 2010

(54) SYSTEM AND METHOD FOR TRANSFERRING DATA AMONG TRANSCEIVERS SUBSTANTIALLY VOID OF DATA DEPENDENT JITTER

(75) Inventors: David J. Knapp, Austin, TX (US); Jason E. Lewis, Driftwood, TX (US)

(73) Assignee: Standard Microsystems Corporation, Hauppauge, NY (US)

( * ) Notice: Subject to any disclaimer, the term of this patent is extended or adjusted under 35 U.S.C. 154(b) by 1005 days.

(21) Appl. No.: 10/253,681

(22) Filed: Sep. 24, 2002

(65) Prior Publication Data

US 2004/0057542 A1 Mar. 25, 2004

(51) Int. Cl.
*H04L 7/00* (2006.01)
(52) U.S. Cl. .................. 375/355; 375/316; 375/354; 375/360; 375/363; 375/364; 375/365; 375/366; 375/371; 375/376
(58) Field of Classification Search ......... 375/354–355, 375/359, 360, 362, 368, 363–366, 371, 373, 375/377, 316, 376, 333, 369; 370/395.62
See application file for complete search history.

(56) References Cited

U.S. PATENT DOCUMENTS

| | | | | |
|---|---|---|---|---|
| 3,683,288 A | * | 8/1972 | Curry ....................... | 375/359 |
| 3,735,135 A | * | 5/1973 | Bredoux et al. .......... | 250/472.1 |
| 3,753,135 A | * | 8/1973 | Kastner et al. ............ | 329/312 |
| 3,903,371 A | * | 9/1975 | Colton et al. ............. | 370/510 |
| 4,118,686 A | * | 10/1978 | Lender ..................... | 375/292 |
| 4,218,770 A | * | 8/1980 | Weller ...................... | 375/360 |
| 4,227,251 A | * | 10/1980 | Kazama et al. ........... | 375/360 |
| 4,231,071 A | * | 10/1980 | Anderson .................. | 360/40 |
| 4,611,335 A | * | 9/1986 | Arai et al. ................. | 375/360 |
| 4,622,586 A | * | 11/1986 | Megeid .................... | 348/532 |
| 4,748,643 A | * | 5/1988 | Setoguchi et al. ......... | 375/369 |

(Continued)

FOREIGN PATENT DOCUMENTS

EP 0 392 653 10/1990

OTHER PUBLICATIONS

International Search Report, application No. PCT/US 03/30053, mailed Mar. 2, 2004.

*Primary Examiner*—Mohammad H Ghayour
*Assistant Examiner*—Sophia Vlahos
(74) *Attorney, Agent, or Firm*—Kevin L. Daffer; Daffer McDaniel, LLP

(57) ABSTRACT

A communication system, clock generation circuit, and method are provided for receiving jitter upon data and to generate a clock reference that does not contain the received jitter. The clock reference can be used either by a digital subsystem of a communication system node, or can be transmitted as substantially jitter-free data from that node to a downstream node of the communication system. Instead of recovering the clock reference from the data having jitter, a pattern is regularly defined within the data stream preferably at periodic, timed intervals. The data pattern may be made up of a series of non-transitions which, regardless of any jitter in the data itself, does not impute any jitter onto a phase-locked loop triggered from an edge of the non-transitioning data pattern. Using the edge as a reference point, a jitter-free clocking signal can be derived at the same frequency as a clocking signal which would normally be produced from the jitter-induced data.

19 Claims, 6 Drawing Sheets

U.S. PATENT DOCUMENTS

| | | | |
|---|---|---|---|
| 4,955,074 A * | 9/1990 | Omoto | 455/182.2 |
| 4,989,223 A * | 1/1991 | Katayose et al. | 377/39 |
| 5,179,450 A * | 1/1993 | Ando et al. | 386/2 |
| 5,231,650 A * | 7/1993 | Satomura | 375/342 |
| 5,317,215 A * | 5/1994 | Kranzler | 327/47 |
| 5,329,556 A * | 7/1994 | Meitner et al. | 375/354 |
| 5,459,765 A * | 10/1995 | Meyer et al. | 375/360 |
| 5,465,268 A * | 11/1995 | Rainbolt | 375/333 |
| 5,473,610 A * | 12/1995 | Rainard | 370/395.62 |
| 5,508,761 A | 4/1996 | Saito et al. | 352/26 |
| 5,598,423 A * | 1/1997 | Meitner | 714/798 |
| 5,696,800 A * | 12/1997 | Berger | 375/361 |
| 5,841,481 A * | 11/1998 | Yoshikawa | 348/500 |
| 5,889,820 A * | 3/1999 | Adams | 375/282 |
| 5,943,378 A * | 8/1999 | Keba et al. | 375/373 |
| 6,008,746 A * | 12/1999 | White | 341/70 |
| 6,101,229 A * | 8/2000 | Glover | 375/354 |
| 6,249,555 B1* | 6/2001 | Rainbolt | 375/354 |
| 6,437,710 B1* | 8/2002 | Tam et al. | 341/58 |
| 6,545,507 B1* | 4/2003 | Goller | 326/93 |
| 6,608,829 B1* | 8/2003 | Johnson | 370/350 |
| 6,748,027 B1* | 6/2004 | Kocaman et al. | 375/316 |
| 6,782,300 B2* | 8/2004 | Pillay et al. | 700/94 |
| 2002/0001359 A1* | 1/2002 | Skierszkan et al. | 375/355 |
| 2005/0280912 A1* | 12/2005 | Park | 360/1 |

* cited by examiner

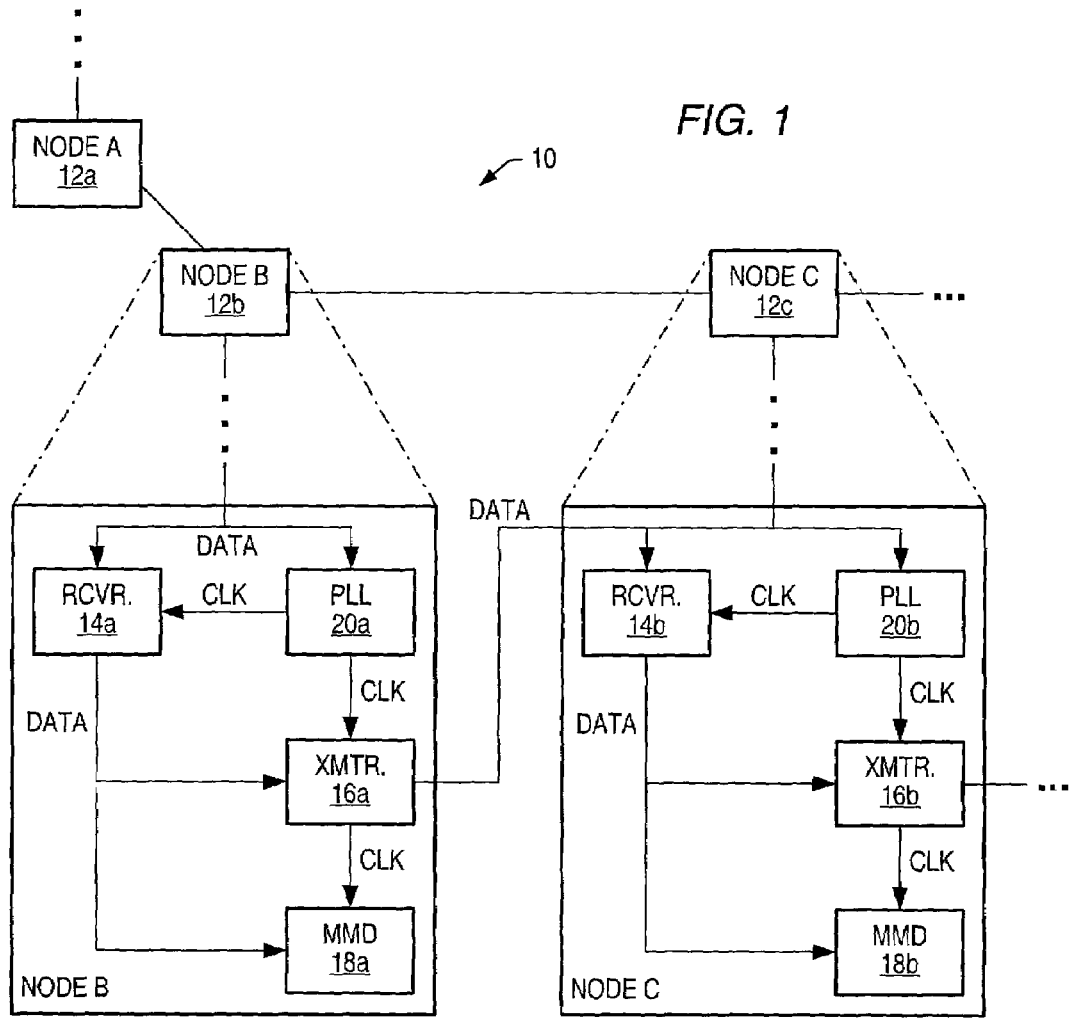
FIG. 1
FIG. 2
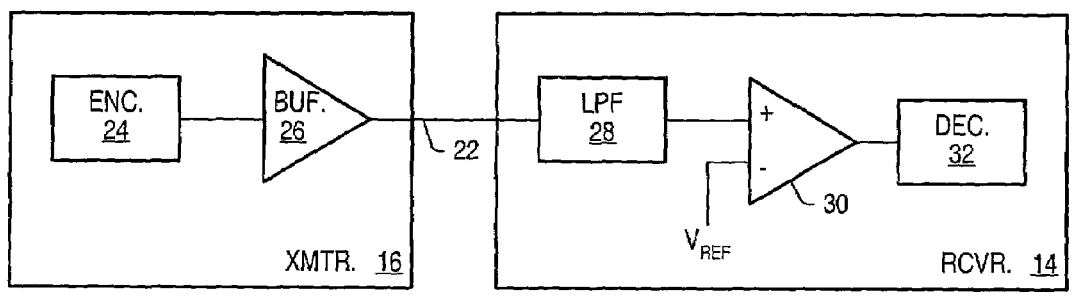
FIG. 3

SYSTEM AND METHOD FOR TRANSFERRING DATA AMONG TRANSCEIVERS SUBSTANTIALLY VOID OF DATA DEPENDENT JITTER

BACKGROUND OF THE INVENTION

1. Field of the Invention

This invention relates to a communication system and, more particularly, to a transceiver that avoids imparting jitter to data transmitted by the transceiver when the transceiver receives data-dependent jitter. The transceiver transmits substantially jitter-free transition edges of the data by constructing a single edge during culmination of a consistent bit pattern within the received data and multiplying the single edge by however many clock cycles are needed to maintain a jitter-free clocking reference for the transmitted data.

2. Description of the Related Art

A communication system is generally well-known as containing at least two nodes interconnected by a communication link. Each node may include both a transmitter and a receiver, generally referred to as a "transceiver." The transceiver provides an interface between signals sent over a communication link and a digital system which operates upon that signal in the digital domain.

It is generally desirable that the communication link accommodate not only digital data, but also various forms of digital data such as audio data, video data, or bursts of data typically derived from a computer domain. The communication link can either be wire-based or wireless. The wired communication link can either be formed of copper or a waveguide of optical fiber.

The digital signals forwarded across the communication system are generally sent from a source to a destination. The source, similar to the destination, is a digital system and, preferably, can be classified as a multimedia device. A multimedia device can include a telephone, a compact disc (CD) player, a digital video disc (DVD) player, a computer, an amplifier, a speaker, or any device which can send and receive different types of data across the transmission line of the network.

Popular types of data include streaming data or packetized data. Streaming data is data that has a temporal relationship between samples produced from the source onto the communication system. The relationship between those samples must be maintained across the communication link to prevent perceptible errors, such as gaps or altered frequencies. A loss in the temporal relationship can cause a receiver at the destination to present jitter, echo or, in the worst instance, periodic blanks in the voice or video stream. Converse to streaming data, packetized data is data which need not maintain the sample rate or temporal relationship of that data and, instead, can be sent as disjointed bursts across the communication link.

Data transmitted across a communication link is generally encoded and placed within a packet or frame. There are numerous encoding schemes currently being used. A popular code includes either a bi-phase code or a, Miller code. The bi-phase code requires that for each logic high value of source data, a transition occurs at the middle as well as boundary regions of that clock phase. In Miller coding, a logic high value is encoded by transitioning at the center or middle of the clock phase, but not at the boundary regions of the clock phase. While Miller coding avoids encoding data at twice the source data rate, Miller coding unfortunately presents an accumulated DC value, the significance of which is set out in the commonly assigned patent application Ser. No. 09/710, 220 entitled "Encoder within a Communication System that Avoids Encoded DC Accumulation and can use Coding Violations to Synchronize a Decoder and Detect Transmission Errors," herein incorporated by reference.

Regardless of the coding technique used, a clock is needed to synchronize with and thereby sample transitions of the streaming or non-streaming data sent across the communication link. In most instances, the master clock used to generate the data originates from the source, whereupon the data is synchronized to the master clock when it is received by a node downstream of the source. Digital systems within the downstream node or nodes often employ various clock recovery techniques to recoup a clock from the data received by that node. Ideally, the recovered clock should transition at a regular and periodic rate, consistent with the master clock of the source node. Unfortunately, however, due in part to the band-limited transmission networks and/or the low-pass characteristics of detectors within one or more nodes, jitter is imparted upon the data as received by the various nodes. If slave clocks are to be accurately recovered, and which substantially mimic the master clock, a technique must be derived that can avoid recovering any jitter induced onto the data stream. This means that if transition rates change depending on whether the encoder encodes a logic 1 or a logic 0 voltage value, that change should not cause downstream jitter recovery problems. A circuit, system, and method is thereby needed which can recover and/or generate a local slave clock absent any data-dependent jitter produced by the band-limited transmission links. Avoiding jitter on the recovered clock not only provides a more accurate synchronous operation of digital subsystems in each nodes, but also prevents compounding the jitter from one node to the next, downstream node.

SUMMARY OF THE INVENTION

The problems outlined above are in large part solved by a clock generation circuit, communication system, and method described herein below. The circuit, system, and method essentially generates a recovered clock not from the encoded data as in conventional design, but instead from a consistent and periodic edge purposely fixed and predefined within the data stream. The edge is preferably preceded by a pattern of data. The pattern of data comprises a pattern of bit values (or voltage values) that is consistent, yet dependent on possibly polarity changes. For example, the pattern can be defined as a set of bit values that do not change from one pattern to the next within the data stream. However, the bit values can be reversed (i.e., changed in polarity) depending on the bit error within the preceding frame, or partial frame. According to one implementation, the pattern is fixed at each periodic placement within the data stream and can be all 1s or all 0s, or a consistent yet variable mixture of 1's and 0's.

Regardless of the pattern chosen, the pattern is sufficiently long enough to ensure a detection circuit used to detect the encoded data produces a relatively consistent voltage at the end of the pattern for similar patterns being used. Accordingly, the pattern (either a positive or negative polarity logic value) can either be discharged or charged thereafter at a consistent rate such that the charged (or discharged) voltage value will cross a threshold value consistently relative to the end of each pattern interspersed regularly throughout the stream of data. This ensures that an edge will occur at consistent and regular moments in time relative not only to the pattern but, more importantly, relative to one another across all frames of data being sent. The edge can then be used to produce a plurality of regularly spaced pulses, at least one of which is phase locked to the edge.

The stream of regular, periodic pulses can therefore be used as a clock signal. The clock signal is substantially jitter-free since the edge does not change or is not modulated in time based on a frequency at which different logic values are sent within the stream of data. Thus, the clock signal recovered in each node is substantially jitter-free—as opposed to a clock signal that is recovered from the data stream itself.

The jitter-free clock signal is hereinafter referred to as a second clock signal, whereas the jitter clock signal is referred to as a first clock signal. While the first clock signal can be used to synchronize receipt of data within a node, preferably the second clock signal is used to synchronize operation of a digital subsystem within that node. Additionally, the second clock signal can be used to synchronize transmission of data from the node to the next, downstream node. In this fashion, jitter induced by a data stream from a first node is not carried forward within the data stream from a second node, and so forth.

According to a first embodiment, a clock generation circuit is provided. The clock generation circuit preferably includes a detection circuit and an oscillator. The detection circuit can receive a stream of data having a pattern of data interspersed at regular intervals within the stream of data. The detection circuit, upon receiving the stream of data, can generate an edge during a time in which the pattern of data ends. Utilizing that edge, the oscillator can then generate a plurality of regularly spaced clock pulses phase synchronized to the edge.

The detection circuit can include a comparator. The comparator can produce the edge at the same time regardless of a rate at which the data preceding the pattern of data transitions. Thus, the edge is produced at the same time regardless of whether the preceding data is encoded as a logic 1, 0, or random voltage value.

The detection circuit can also include a pair of logic gates. The first logic gate can receive a polarity signal indicating whether the pattern is a logic 1 or logic 0 polarity. The second logic gate can then output the edge regardless of the polarity of the pattern, and a state machine can produce a window pulse that repeats at the same periodic rate in which the pattern of non-transitioning data repeats.

The pattern of data preferably extends for a duration exceeding a reciprocal of the cut-off frequency of a low-pass filter associated with the detection circuit. The duration ensures voltage output from the detection circuit achieves a consistent voltage value when the pattern of data ends. The pattern data preferably occurs equi-distance apart within the stream of data, either within a preamble between frames or within the frames themselves. The pattern can occur once per frame, but is separate from the encoded data associated with the data stream.

According to one example, a first phase-locked loop (PLL) can receive the stream of data and generate a first clock from that stream. A second PLL preferably aligns at least one phase of the regularly spaced clock pulses generated therefrom with the edge to form a second clock. A buffer can be used to receive the stream of data synchronized to the first clock, yet is configured to output the stream of data to a digital circuit synchronized to the second clock. Thus, while the first clock contains jitter, the second clock does not.

According to another embodiment, a communication system is provided. The communication system includes a receiver and a synchronous circuit. The receiver is coupled to receive a pattern of data (e.g., a pattern of bit values) within a data stream. The pattern of bit values may be a series of known logic values, or may be a sequence of non-transitioning data. The bit values are sent at regular intervals and are used to generate an edge from each pattern. The edge is defined as a transition from one logic voltage value to another logic voltage value. Preferably, the edge is a transition from a logic low voltage value to a logic high voltage value (or vice-versa). One of a plurality of regular clock pulses (second clock) are generated in phase with the edge, wherein the pattern of bit values transition at a rate less than the cut-off frequency of the receiver. The synchronous circuit is coupled to process data synchronized to the plurality of regular clock pulses (second clock). The synchronous circuit can either be a transmitter or a multimedia device, such as a digital circuit synchronized to edges of the second clock.

According to yet another embodiment, a method is provided. The method preferably transfers data substantially free of jitter, and comprises initially a step of receiving data. A first clock (first clocking signal) is compiled having jitter dependent on a frequency at which the rate changes. In addition to receiving the data, periodic patterns within the data are also received. Those patterns are preferably non-transitions which formulate an edge at the same time relative to the terminations of each of the periodic patterns independent of the change in the rate. A second clock (second clocking signal) is compiled synchronized to the edge and having regularly occurring pulses transitioning at substantially the same rate as the first clocking signal, yet absent jitter attributed to the first clocking signal. Thus, data can be synchronized to the second clocking signal and transferred substantially jitter-free.

BRIEF DESCRIPTION OF THE DRAWING

Other objects and advantages of the invention will become apparent upon reading the following detailed description and upon reference to the accompanying drawings in which:

FIG. 1 is a block diagram of a communication system of interconnected nodes across which different types of encoded data can transition at dissimilar rates possibly dependent on the logic value being sent;

FIG. 2 is a block diagram of a pair of nodes, each comprising a transceiver, a clock-constructing PLL, and a digital subsystem, such as a multimedia device;

FIG. 3 is a block diagram of a transmitter of a transceiver within a first node communicating with a receiver of a transceiver within a second node;

DETAILED DESCRIPTION OF PREFERRED EMBODIMENTS

Figure 4:
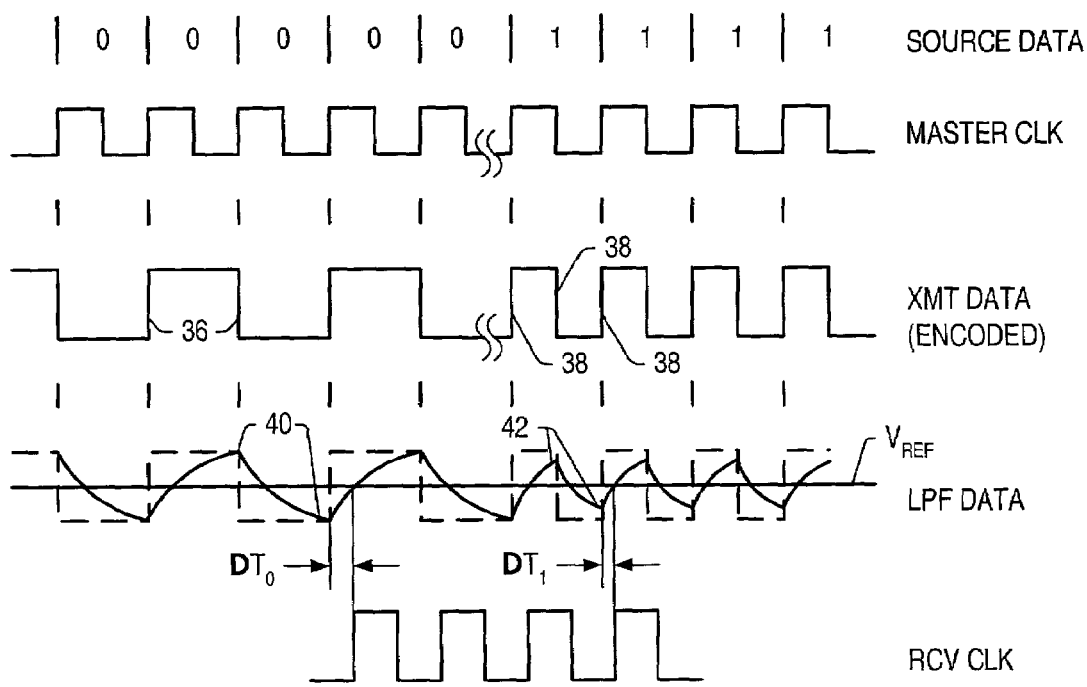
FIG. 4 is a timing diagram of encoded data sent from a source node, and deleterious data-dependent, low-frequency jitter being caused by the encoded data being low-pass filtered at a transceiver and forwarded to a destination node.

Turning now to the drawings, FIG. 1 illustrates one example of a communication system 10. Communication system 10 includes an interconnected plurality of nodes 12. For sake of brevity, only three nodes are shown. However, it is understood that system 10 can include more than three nodes and can also include multiple interconnected networks. Thus, system 10 can be made up of multiple local networks or multiple local buses. Communication system 10 shown in FIG. 1 is a ring or loop. However, it also understood that the network backbone can be a bus, star, or any other topology available to a network. Coupled between nodes 12 are corresponding communication links. Such links can be optical, acoustic, or electrical (wired or wireless).

FIG. 2 illustrates detailed, block diagram views of node B and node C of the interconnected plurality of nodes 12. Each node includes a network interface system coupled between communication links and a digital system. The network interface can include a transceiver, while the digital system can be a multimedia device. Shown in FIG. 2 is a receiver 14 and transmitter 16 attributed to each transceiver of each node, as well as a multimedia device 18 attributed to the digital subsystem. In order to synchronize operation of the transceiver as well as the multimedia device, a PLL 20 is used to recover clock transitions from the data stream received by receiver 14. Those transitions are thereafter used to synchronize operation of the receiver 14, transmitter 16, and multimedia device 18. For example, multimedia device 18 can be a digital signal processor used to process the data sampled in accordance with the clocking signal recovered by PLL 20. If, for example, node 12, which receives the data stream, is not the destination, then the received data sampled by the recovered clocking signal is forwarded to a transmitter 16 which, thereafter, sends the data downstream to the next node (i.e., the next receiver within the next node). The process is repeated across multiple nodes until the sourced data finally arrives at the destination.

FIG. 3 illustrates in more detail certain aspects of a transmitter 16 sending data to a receiver 14, each of which are attributed to dissimilar nodes connected by a communication link 22. Generally speaking, the data stream can be modulated in some fashion and, more preferably, can be encoded by transmitter 16 before being sent across communication link 22. Encoder 24 thereby encodes, for example, NRZ data that is then buffered or amplified to the proper signal levels by buffer 26. The encoded, buffered data stream is then sent across communication link 22 to a receiver which preferably functions similar to a low-pass filter 28 and a comparator 30. The low-pass filter 28 is preferably designed to remove spurious noise and other artifacts from the received data before forwarding the data to a comparator. The comparator then discerns whether the data should be a logic 1 bit value or a logic 0 bit value depending on how the voltage magnitude of that data compares with a reference voltage. The reference voltage ($V_{REF}$) is preferably set somewhere near a midlevel voltage value between the positive (or power) and negative (or ground) voltages. If the data stream is encoded, then included with receiver 14 is a decoder 32. Decoder 32 essentially receives encoded data and produces NRZ data therefrom.

An unfortunate aspect of implementing a low-pass filter within the receiver is that the cut-off frequency of the low-pass filter may be sufficient for data transmitted at one rate, but insufficient for data transmitted at another, faster rate. Since encoded data transitions typically at dissimilar rates depending on whether a logic 1 or a logic 0 is encoded, the low-pass filter may slightly attenuate output from comparator 30 if the cutoff frequency of the low-pass filter is near or less than the higher speed transitions of the data stream as shown in FIG. 4.

FIG. 4 illustrates a bit pattern of source data being transferred to a receiver via a master clock. In the example provided, the source data is encoded by a transmitter synchronized to the master clock. Each logic 0 bit value transitions at the boundary of that bit (i.e., represented as a full clock cycle). However, a logic 1 bit value is encoded with transitions at both the boundaries of the bit value as well as at the middle between bit boundaries, as shown by comparing reference numerals 36 and 38. Thus, logic 1 bit values transition at twice the rate as logic 0 bit values. Depending on the cut-off frequency characteristics of the low-pass filter and downstream PLL adapted to receive the encoded data, low frequency jitter may arise whenever substantially long logic 0 bit values are followed by substantially long logic 1 bit values.

As shown by reference numeral 40, output from the low-pass filter is capable of a full extension to the positive or negative voltage values whenever the substantially longer logic 0 bit values are encoded and received by the receiver. However, as shown by reference numeral 42, if a logic 1 bit value occurs, then insufficient time to fully charge (or discharge) the output from the filter occurs. Instead of fully charging and discharging as in reference numeral 40, reference numeral 42 indicates a dissimilar switch point at the moment in which the output from the low-pass filter transitions above or below the reference voltage ($V_{REF}$).

The shift in time occurs because of slight attenuation at the output of the low-pass filter. As shown, the shift assumes the output from the low-pass filter begins slightly higher than if the output were fully discharged and, thereby, crosses $V_{REF}$ sooner than if the output were fully discharged. Thus, $\Delta T_1$ is less than $\Delta T_0$ to indicate a shift at the boundary between when an encoded logic 0 occurs and an encoded logic 1 occurs. The amount of jitter is thereby represented as the difference of $\Delta T_0 - \Delta T_1$. The difference appears periodically at a frequency dictated by the number of logic 0 bit values followed by the number of logic 1 bit values (or vice-versa). If the number of logic 0 bit values and logic 1 bit values within a frame is substantially large, then repeats of those large bit values will cause a relatively low frequency jitter. However, if the number of logic 0 bit values and logic 1 bit values strung together is fairly small, then the jitter frequency will increase. Whatever jitter occurs at the receiver, unfortunately, will be presented to the PLL within the receiver. As such, the low-pass characteristics of the PLL will generate a received clock (RCV CLK) signal having the imputed jitter reconstructed thereon.

Figure 5:
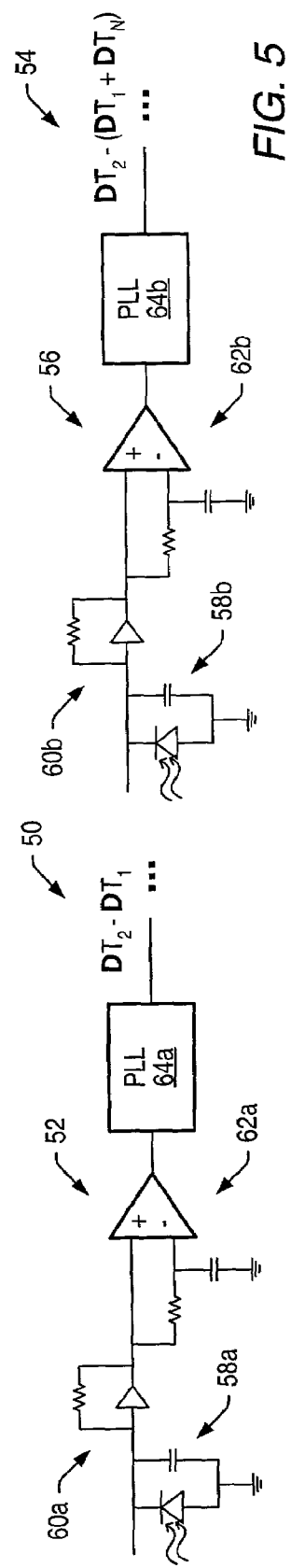
FIG. 5 is a block diagram of the data-dependent jitter of FIG. 4 accumulating among transceivers from the source node to the destination node.

FIG. 5 illustrates in more detail jitter 50 produced by receiver 52 and the problems of jitter 50 accumulating, as shown by reference numeral 54 on a downstream receiver 56.

Receivers 52 and 56 are coupled by a communication link which, in the example shown, can be an optical fiber. Thus, each receiver which receives optical signals includes a photo detector circuit 58, buffer 60, and comparator circuit 62. Comparator circuit 62 can include a low-pass filter element used to fix the reference voltage on the negative terminal of the comparator. The reference voltage is thereby typically a low-pass filtered version of the received signal with a cut-off frequency orders of magnitude lower than the data rate.

The positive terminal receives the data stream and, similar to the low-pass filter on the negative terminal, the positive terminal receives low-pass filtered data. The low-pass filtered data is that which normally occurs since every conductor has a resistance value as well as a capacitance value relative to a power plane or ground. Therefore, any data stream received upon receivers 52 and 56 is low-pass filtered before it is sent to the compare circuitry 62 to minimize noise in the receiver.

Within each receiver 52 and 56 is a PLL 64. PLL 64 also has a low-pass filter characteristic with respect to input phase variation or jitter. In other words, PLL 64 may be unable to lock to relative rapid changes in data stream transitions associated with, for example, high-speed jitter. However, most PLLs can lock to lower frequency transitions associated with low frequency jitter. Jitter at frequencies below the loop bandwidth of the PLL are tracked by the PLL and jitter at frequencies above the loop bandwidth are attenuated. If the alternating data patterns of logic 1 and logic 0 bit periods that produce the alternating frequency components at the receiver are changing at a rate below the PLL loop bandwidth, the PLL 64 will simply track that jitter and place the jitter on the reconstructed clock signal, as shown by reference numerals 50 and 54.

Figure 6:
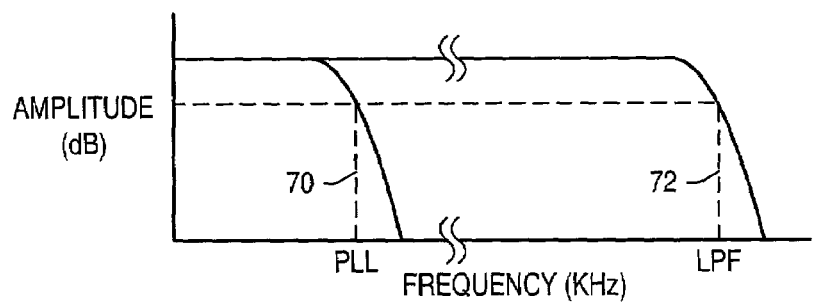
FIG. 6 is a graph of frequency versus amplitude, showing the cutoff frequency for the low pass filter and the PLL of FIGS. 2 and 5.

FIG. 6 illustrates the bandwidth (or alternatively, the cut-off frequency) of the low-pass filter within a PLL, as shown by reference numeral 70, as well as the low-pass filter upstream of the comparator, as shown by reference numeral 72. For example, the master clock of a particular node used to synchronize data within that node can transition at 50 MHz. Accordingly, the encoded data transmitted from that node can either transition at 25 MHz (for logic 1 encoded bits) or 12.5 MHz (for logic 0 encoded bits). Preferably, the low-pass filter within the receiver has a cut-off frequency 72 greater than the higher frequency at which the all 1 logic values are being sent. Moreover, the cut-off frequency 70 of the PLL has a cut-off frequency lower than the frequency at which jitter occurs on the recovered clock. As defined herein, the term "cut-off frequency" can refer to a maximum usable frequency. The gain drops as the frequency is increased. Thus, as the frequency is raised, the frequency at which the voltage attenuation becomes 3 decibels, relative to the level of the operating range, is thereby called the cut-off frequency. As long as the string of all 1 logic values and all 0 logic values are sufficiently long, jitter will deleteriously result on the received clock if the cut-off frequency of the PLL is higher than the frequency of the jitter.

Figure 7:
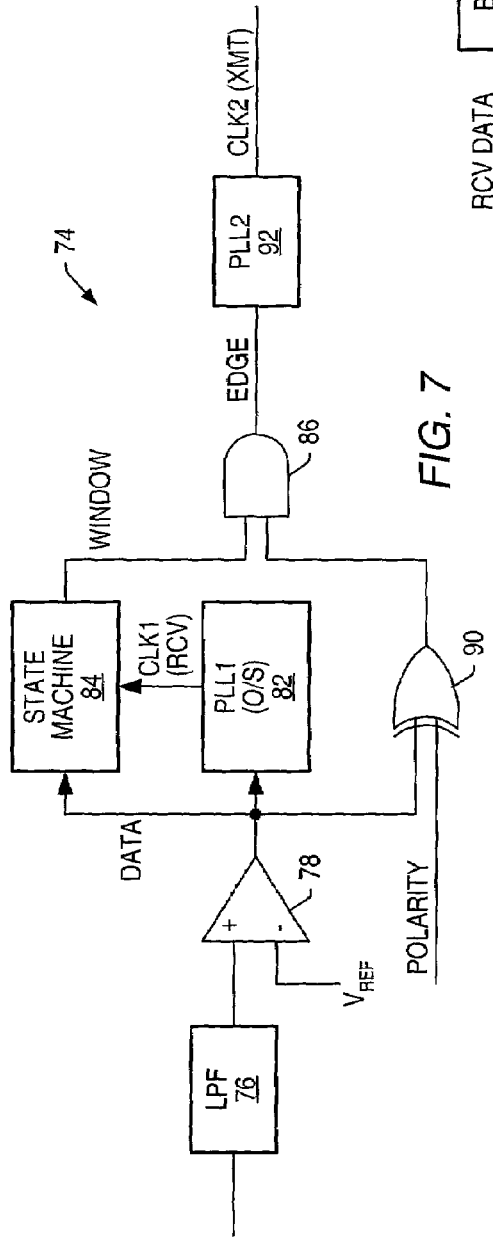
FIG. 7 is a block diagram of an improved transceiver and, more particularly, an improved receiver of the transceiver having a first PLL, a window generation state machine responsive to a first clock signal recovered by the first PLL, and a logic gate that generates an edge after a pre-determined pattern of logic values have been detected, possibly within a preamble of a frame of data, whereby the edge is used to synchronize with an edge multiple pulses of a second clock signal produced from a second PLL.

Referring to FIG. 7, an improved receiver 74 is shown. The front-end of receiver 74 is modeled identical to a conventional receiver having a low-pass filter 76 and a comparator 78. Output from comparator 78, therefore, contains jitter dependent on the bit values of the data stream and the low-pass filtering characteristics of filter 76. However, instead of using the jittered output to reconstruct a clock which will then be used by the local digital system and/or transmitted downstream across the network, improved receiver 74 uses a periodic, predetermined pattern to create the synchronizing clock.

Output from comparator 78 is fed into a sampling subsystem 82. Block 82 can be realized either as a first PLL or as an oversampling circuit. If implemented as a PLL, transitions of the serial data stream detected by comparator 78 are locked to by the PLL, and a first clock signal (CLK1) is forwarded from block 82 to a state machine 84. Instead of being implemented as a PLL, block 82 can simply be an oversampling circuit provided a high frequency clock is available to oversample the received data stream and detect the location of the pattern of bit values within that data stream needed to trigger an edge from a logic gate 86.

It may be desirable and more cost effective to avoid providing an oversampling local clock. Thus, block 82 may preferably be realized using a PLL and, more specifically, a high bandwidth PLL. A high bandwidth PLL is one having a relatively high frequency cut-off in order to recover any and all clock artifacts from the serial data stream, including jitter contained on that data stream. The jittered clock (CLK1) thereby synchronizes a state machine and finds the periodic pattern of bits. The pattern of bits can be realized as a coding violation, with a fixed number of non-transitioning bit periods, or can simply be a synchronizing pattern possibly placed within a preamble preceding each frame of data sent across the communication system. Details of how state machine 84 produces a window pulse "around" the edge will be described below in reference to FIGS. 11 and 12.

Logic gate 86 triggers the edge signal when the window pulse and the output from logic gate 90 are at a logic high voltage value, for example. When an input to gate 86 is low, then the edge output also goes low. Logic gate 86 is preferably an AND gate, and logic gate 90 can be an exclusive OR gate that receives the serial data stream and a polarity signal. The polarity signal is derived from possibly another state machine that detects the polarity of the fixed patterns, which is determined during network initialization and typically remains unchanged until the network is re-initialized.

As will be described in reference to FIG. 10, the coding violation polarity can be either a logic 1 or a logic 0. However, at the end of that coding violation, a transition must occur. The moment in which the data stream transitions from the coding violation, a 10 or a 01 input is placed upon logic gate 90, thereby forcing a logic 1 output into one input of gate 86. Once this input goes high, an edge is produced at the output of logic gate 86, and remains until either the window pulse or the output of logic gate 90 goes to a logic 0 voltage value. It is the forward transition or edge that is used by a second PLL 92. PLL 92 has a phase detector input that aligns one pulse among many regularly spaced pulses to the edge, where the number of pulses is determined by the feedback divider of PLL 92. The feedback divider ratio is set so that a second clock of regularly spaced pulses can be the same frequency as the first clock. However, instead of having jitter imputed to the second clock, the second clock is triggered from a non-jittered edge since, in fact, the data pattern is long enough to ensure the output from low-pass filter 76 reaches a fixed value at the end of the pattern independent of the data that preceded the pattern. This ensures comparator 78 will transition at the same time after the pattern is terminated, regardless of the data stream transition frequencies.

Figure 8:
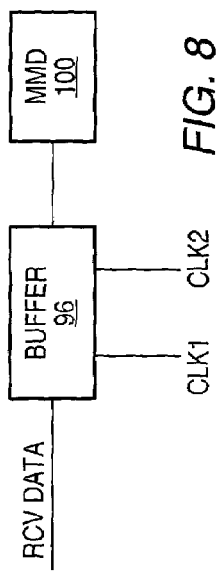
FIG. 8 is a block diagram of at least one first-in-first-out (FIFO) buffer used to temporarily receive and store data using the first clock of FIG. 7 having jitter and for transferring the stored data out from the buffer using the second clock of FIG. 7 absent jitter.

FIG. 8 illustrates in more detail possible uses of the first and second clocking signals. Given that the first PLL is a high bandwidth PLL, it may be necessary to receive the data having jitter using a first clock having the same jitter values. Thus, buffer 96 is ensured of synchronizing to and consistently receiving the jittered data stream receiving the data at the first clocking signal rate. However, buffer 96 ensures that the data stream being sent does not contain jitter since it is sampled by a jitter free second clocking signal onto, for example, a synchronous digital system such as a transmitter or a multimedia device 100. Buffer 96 is preferably a first-in-first-out (FIFO) buffers having sufficient size to accommodate slight fluctuations between the rate in which jittered data is received and non-jittered data is forwarded (i.e., overflow and underflow).

Figure 9:
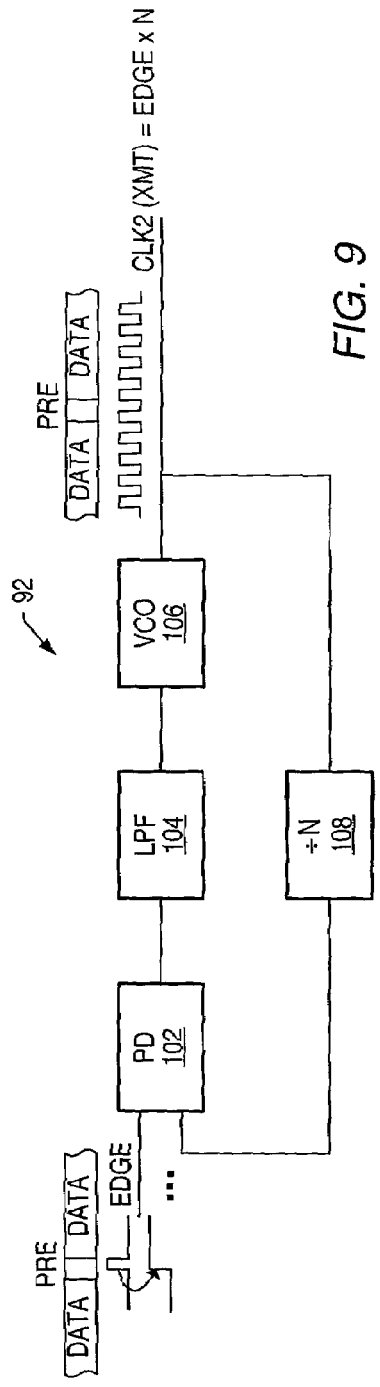
FIG. 9 is a block diagram of the second PLL that is triggered from the edge produced from the transceiver of FIG. 7, wherein the second PLL utilizes a divide-by counter in the feedback loop to generate the second clock having N cycles at regular intervals synchronized to the edge.

FIG. 9 illustrates in more detail the second PLL 92 (FIG. 7). PLL 92 preferably includes a phase detector 102, low-pass filter 104, voltage-controlled oscillator 106, and a divider 108. Phase detector 102 is an edge-triggered phase detector preferably implemented as a set of latches or flip-flops that are set when an edge and feedback edge are received, and reset sometime thereafter. The set input disparity between the edge input and the feedback edge input (in phase) causes a pump-up or a pump-down signal to be sent to filter 104 and eventually to oscillator 106.

As shown in FIG. 9, the edge forwarded to one input of phase detector 102 is phase-aligned to an edge forwarded from the divider. Thus, the forward transition or edge caused by gate 86 (FIG. 7) triggers phase-alignment when PLL 92 is locked. The oscillator 106 output forms the second clock and divider 108 divides the high frequency, second clock output from oscillator 106 to produce a lower frequency clock having an edge coinciding in phase with the edge from gate 86 (FIG. 7) and forwarded to PLL 92. The pattern may or may not be present during the preamble and, therefore, the edge may or may not be present during the preamble. There are numerous examples of phase detectors using flip-flops, such examples may be obtained from, for example, Phillips Semiconductor Corp. or Analog Devices Corp.

Figure 10:
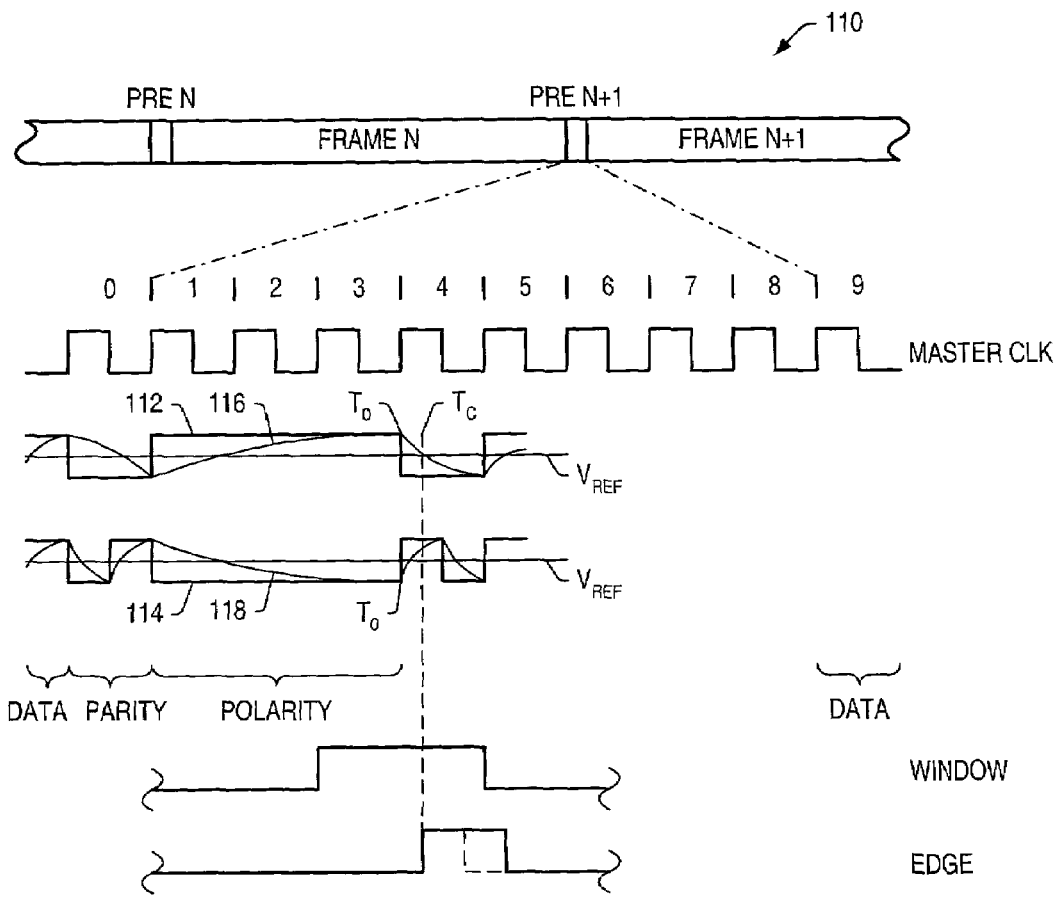
FIG. 10 is a timing diagram of a pattern of data, possibly within a preamble of a frame of data where, upon detecting the pattern, an edge is produced at a moment in which the pattern ends and a window pulse exists.

FIG. 10 illustrates in more detail the formation of the edge. In particular, a stream of data is shown having preferably a regular and periodic preamble interspersed between frames of the data. Contained within each preamble might be a sync pattern or otherwise a fixed pattern of data bit values. Preferably, the pattern constitutes a coding violation. The pattern is shown as possibly eight bit periods, where the first three bit periods are shown as three logic 1 or logic 0 voltage values. The pattern is shown having a rather lengthy, non-transitioning voltage value that transitions at the end of the third bit period. Instead of a logic 1 bit value being bi-phase coded and a logic 0 bit value being bi-phase coded, the logic 1 and logic 0 bit values do not change either in the middle or at the boundaries of the corresponding bit. Thus, the pattern constitutes a coding violation since, for bi-phase coding, a transition must occur either at a bit boundary or at the middle of the bit boundary. For Miller coding, transitions must occur either at the midpoint between boundaries or at the boundaries.

The pattern occupying the first, second, and third bit periods do not transition whatsoever, as shown by reference numeral 112 and 114. Thus, when fed into the low-pass filter of a receiver, output from the low-pass filter will increase or decrease to a steady state, non-attenuated voltage value as shown by reference numerals 116 and 118. The duration of the non-transition thereby extends significantly lower than the reciprocal of the cut-off frequency of the low-pass filter. This ensures that the voltage at time $T_0$ is independent of the data pattern preceding the preamble. Since the output from the low-pass filter reaches the same voltage at time $T_0$, the transition at time $T_0$ will cause output from the low-pass filter to transition at the same rate so that the output crosses $V_{REF}$ at the same time relative to $T_0$. The crossover time is marked as $T_C$, and is shown to form the output from the comparator. Waveforms 112 and 114 in FIG. 10 depict a pattern of data, or bit values. The pattern need not be non-transitioning data, as shown, but simply a consistent pattern of transitioning data.

The data before and after the coding violations representing patterns 112 and 114 is different and therefore the patterns 112 and 114 can have dissimilar polarity.

Importantly, output from the comparator is forwarded into a logic gate which also receives the polarity voltage value. If the three bits are at a logic high voltage value, then the polarity is a logic 1 voltage value which, when combined with a transition to a logic 0 voltage value, will output a signal from, for example, the exclusive OR gate. The signal from the gate and the trailing edge of the window pulse will, therefore, establish the inputs to the gate 86 (FIG. 7). Accordingly, an edge is defined as the leading edge of the edge pulse produced from the gate. The leading edge of the edge pulse is shown occurring between the leading and trailing edge of the window pulse. The duration of the edge pulse can vary depending on the data pattern. For example, if waveform 112 occurs, the edge pulse can be slightly longer than the edge pulse (shown in dashed line) should waveform 114 occur. The falling edge resulting from waveform 112 of the edge pulse is shown to coincide with the filtered waveform 116 crosses $V_{REF}$; however, the falling edge of the edge pulse resulting from waveform 114 is approximately one-half a master clock shorter.

Figure 11:
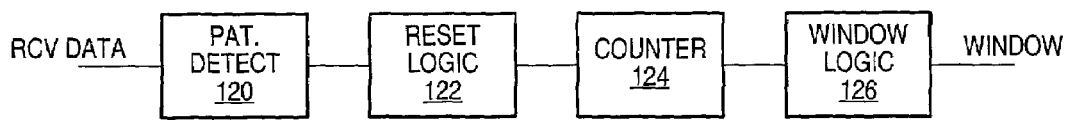
FIG. 11 is a block diagram of the window generation state machine of FIG. 7.

FIG. 11 illustrates the window state machine 84 (FIG. 7). Like all state machines, window state machine is a sequential set of logic circuitry, beginning with a pattern detector 120. The pattern detector detects, for example, a coding violation in the received data. The coding violation could be a series of three logic high voltage values strung together either within a preamble or a portion of the frame itself. Once the pattern is detected, a reset circuit 122 will send a reset signal. The reset signal is received by a counter 124 to terminate a count of the clock cycles. The reset signal is disabled, however, after the pattern has been detected to indicate resumption of the count. Window logic 126 determines which count is to be used to fix the window pulse. For example, each frame may be 63 bytes long and each preamble is 1 byte long. This means that there are 512 bit periods, where every N and N+1 bit period formulate the window pulse in the interim between the counter being reset. Thus, the window pulse is shown as the third and fourth bit periods of a particular bit in FIG. 10, repeated for each frame.

Figure 12:
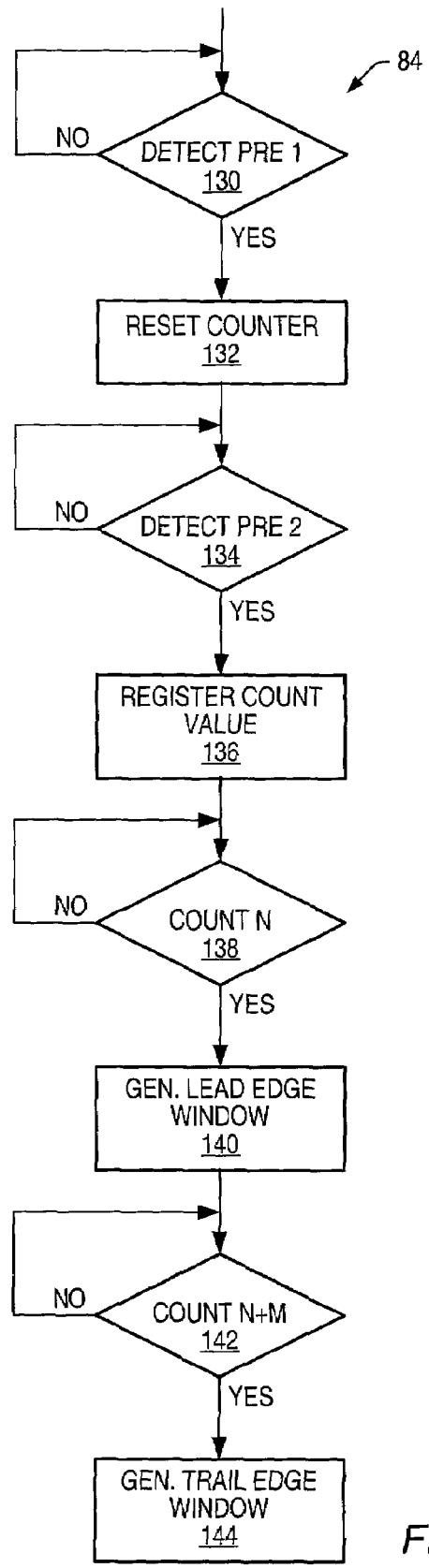
FIG. 12 is a flow diagram of the window generation state machine of FIGS. 7 and 11.

FIG. 12 illustrates a possible flow diagram of state machine 84 (FIG. 7). If the count between preambles is not specified, or the count between patterns is not initially known, then it may be desirable to detect a pattern/preamble, reset a counter, and begin the count until the next pattern/preamble is detected as shown in steps 130, 132 and 134. However, generally speaking, the count between patterns/preambles is known and fixed. Thus, the state machine 84 usually begins with a known count value as shown by step 136.

It may be desirable to begin the window pulse one or two bit periods after the beginning of each regularly occurring pattern and, as such, count N can be equal to 2, as shown by block 138. In the example of FIG. 10, the window is begun on the third count after the beginning of pattern 112/114. Thus, when the third count arises, a leading edge of the window pulse is generated 140. It may be desirable to make the window pulse two or more bit periods long. In the example of FIG. 10, the window pulse is two bit periods long and, therefore, a count of M=1 is added to the count of N=3, as shown by block 142. The cumulative count of N+M, therefore, defines the trailing edge of the window pulse, as shown by block 144.

Regardless of the duration of the window, it is preferred that the window begins sufficiently before the edge and terminates sufficiently after the edge. The amount by which the window occurs before and after the edge is determined somewhat by the amount of jitter that would arise on the leading and trailing edges of the window pulse to ensure at all times the window will begin before and after the edge, even in instances of severe jitter. Numerous other variations and modifications will become apparent to those skilled in the art once the above disclosure is fully appreciated. It is intended that the following claims be interpreted to embrace all such variations and modifications.

What is claimed is:

1. A clock generation circuit, comprising:
a detection circuit coupled to receive a stream of data having a repeating pattern of data regularly interspersed within a preamble portion of the stream of data, and to generate an edge during the preamble portion, and during a time no more than one bit after which the pattern of data ends, but not during prior transitions of the pattern of data;
an oscillator coupled to generate a plurality of regularly spaced clock pulses phase synchronized to the edge;
a window state machine coupled to receive a first clock generated from the stream of data and to produce a window pulse synchronized to the first clock and having a duration that begins prior to the edge and ends after the edge; and
logic coupled to produce the edge only during times when the window pulse exist.

2. The clock generation circuit as recited in claim 1, wherein the detection circuit is coupled to produce the edge at the same time regardless of a rate at which the data preceding the pattern of data transitions.

3. The clock generation circuit as recited in claim 1, wherein the detection circuit is coupled to produce the edge at the same time regardless of whether the stream of data preceding the pattern of data is encoded as a logic one, logic zero, or random logic value.

4. The clock generation circuit as recited in claim 1, wherein the detection circuit comprises:
a first logic gate coupled to output the edge independent of a polarity of the pattern of data; and
a second logic gate coupled to receive the output from the first logic gate during a window pulse that repeats at least one time during which the pattern of data repeats.

5. The clock generation circuit as recited in claim 1, wherein the pattern of data extends for a duration exceeding the reciprocal of the cutoff frequency of a low-pass filter associated with the detection circuit.

6. The clock generation circuit as recited in claim 1, wherein the pattern of data extends for a duration that ensures voltage output from the detection circuit achieves the same value at the end of the pattern independent of any preceding data.

7. The clock generation circuit as recited in claim 1, wherein the pattern of data extends during the preamble portion between frames of the stream of data.

8. The clock generation circuit as recited in claim 1, wherein the pattern of data extends for a time period indicative of a coding violation, and wherein the detection circuit is adapted to detect the coding violation.

9. The clock generation circuit as recited in claim 1, wherein the regularly spaced clock pulses are forwarded to a digital circuit for synchronizing operation thereof.

10. The clock generation circuit as recited in claim 1, further comprising:
a first phase-locked loop coupled to receive the stream of data and generate a first clock therefrom;
a second phase-locked loop having a phase detector that aligns at least one phase of the regularly spaced clock pulses with the edge to form a second clock therefrom; and
a buffer coupled to receive the stream of data synchronized to the first clock and to output the stream of data to a digital circuit synchronized to the second clock.

11. A communication system, comprising:
a receiver coupled to receive a repeating pattern of bit values regularly interspersed within a preamble portion of a data stream and to generate an edge during the preamble portion, and no more than one bit after each said pattern terminates, wherein one of a plurality of regular clock pulses are generated in phase with the edge;
a synchronous circuit coupled to process data synchronized to the plurality of regular clock pulses;
a window state machine coupled to produce a window pulse synchronized to a first clock generated from the data stream, beginning before the edge and ending after the edge; and
logic coupled to produce the edge only during times when the window pulse exists.

12. The communication system as recited in claim 11, wherein the synchronous circuit comprises a transmitter coupled to transmit the data synchronized to the plurality of regular clock pulses.

13. The communication system as recited in claim 11, wherein the synchronous circuit comprises a multimedia device.

14. The communication system as recited in claim 11, wherein the receiver comprises a detection circuit coupled to detect logic value transitions of the data stream and to
produce a relatively variable output depending on a logic value of the data stream, and
produce a relatively fixed output at the culmination of the pattern of bit values.

15. The communication system as recited in claim 11, wherein the pattern of bit values correspond to a coding violation.

16. The communication system as recited in claim 11, wherein a reciprocal of the time duration of pattern of bit values is less than the cut off frequency of the receiver.

17. A method for transferring data substantially free of jitter, comprising:
generating an edge during a preamble portion of a stream of data, and at the same time relative to an end of a consistent and unchanging pattern of bit values, but not during the pattern of bit values, and not more than one bit after the pattern of data ends;
producing a window pulse synchronized to a first clock generated from the data stream, beginning before the edge and ending after the edge;
producing the edge only during times when the window pulse exists;
receiving the stream of data transitioning at a rate dependent on a logic value of the data;
compiling a first clocking signal having jitter dependent on a frequency at which the rate changes;
compiling a second clocking signal synchronized to the edge and having regularly occurring pulses transitioning at substantially the same rate as the first clocking signal; and
transferring the data synchronized to the second clocking signal.

18. The method as recited in claim 17, wherein said receiving and compiling steps occur within a first transceiver and said transferring step occurs within a communication link coupled between the first transceiver and a second transceiver of a communication system.

19. The method as recited in claim 17, wherein said transferring comprises operating a digital system synchronized to the second clocking signal.

* * * * *